(12) United States Patent
Corsi et al.

(10) Patent No.: US 7,863,985 B1
(45) Date of Patent: Jan. 4, 2011

(54) HIGH FREQUENCY AMPLIFIER LINEARIZATION TECHNIQUE

(75) Inventors: Marco Corsi, Parker, TX (US); Kenneth G. Maclean, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/511,768

(22) Filed: Jul. 29, 2009

(51) Int. Cl.
*H03F 1/14* (2006.01)
(52) U.S. Cl. .................................. 330/292; 330/288
(58) Field of Classification Search ............... 330/292, 330/288; 323/315, 316
See application file for complete search history.

(56) References Cited

U.S. PATENT DOCUMENTS

| | | | | |
|---|---|---|---|---|
| 4,965,510 A * | 10/1990 | Kriedt et al. ............... | 323/315 |
| 4,999,585 A | 3/1991 | Burt et al. | |
| 5,479,133 A * | 12/1995 | Dow ........................... | 330/267 |
| 6,392,489 B1 * | 5/2002 | Ragan et al. ................ | 330/288 |
| 6,489,849 B1 * | 12/2002 | Gilbert ....................... | 330/284 |
| 6,771,124 B1 | 8/2004 | Ezell | |
| 7,102,440 B2 * | 9/2006 | Damitio et al. ............. | 330/267 |
| 2009/0058522 A1 | 3/2009 | Sugihara et al. | |

* cited by examiner

*Primary Examiner*—Henry K Choe
(74) *Attorney, Agent, or Firm*—John J. Patti; Wade J. Brady, III; Frederick J. Telecky, Jr.

(57) ABSTRACT

An output stage for an amplifier is provided. The amplifier generally provides for compensation of an error current generated by the base-collector (or gate-drain) capacitance of a common base (or gate) amplifier transistor. The stage accomplishes this by utilizing a three transistor Wilson current mirror to combine the error current with a mirrored bias current to reduce the load current on the common base (or gate) amplifier transistor.

13 Claims, 1 Drawing Sheet

US 7,863,985 B1

HIGH FREQUENCY AMPLIFIER LINEARIZATION TECHNIQUE

TECHNICAL FIELD

The invention relates generally to linearization of a high frequency amplifier and, more particularly, to correcting for base-collector capacitance.

BACKGROUND

Referring to FIG. 1 of the drawings, reference numeral 100 generally designates a bipolar common base amplifier gain stage. In this stage 100, an alternating current or AC signal $I_{IN}$ is applied to the emitter of PNP transistor Q1 by source 102. Transistor Q1 can then apply an output current $I_{LOAD}$ to a load. One problem with this arrangement is that there is a parasitic base-collector capacitor $C_{CB}$ that forms a path for the collector current in parallel with the load, resulting in the output load $I_{LOAD}$ being less than the input current $I_{IN}$ by an error current $\delta I_1$. Thus, it is desirable to correct for this error current.

Some examples of conventional circuit are U.S. Pat. No. 4,999,585; U.S. Pat. No. 6,771,124; and U.S. Patent Pre-Grant Publ. No. 2009/0058522.

SUMMARY

A preferred embodiment of the present invention, accordingly, provides an apparatus is provided. The apparatus comprises a first current mirror having a first and a second set of terminals, wherein at least one terminal from the first set of terminals of the first current mirror receives an input signal, and wherein at least one terminal from the second set of terminals of the first current mirror is coupled to an output node; a transistor having a first passive electrode, a second passive electrode, and a control electrode, wherein the transistor is coupled to at least one terminal from the second set of terminals of the first current mirror at its first passive electrode and to at least one terminal from the second set of terminals of the first current mirror at its control electrode; a current source that is coupled to the control electrode of the transistor; and a second current mirror having a first and a second set of terminals, wherein at least one terminal from the first set of terminals of the second current mirror is coupled to the second passive electrode of the transistor, and wherein at least one terminal from the second set of terminals of the second current mirror is coupled to the current source, and wherein at least one terminal from the second set of terminals of the second current mirror is coupled to the output node.

In accordance with a preferred embodiment of the present invention, the transistor further comprises a PNP transistor, wherein the first passive electrode is the emitter, the second passive electrode is the collector, and the control electrode is the base.

In accordance with a preferred embodiment of the present invention, the apparatus further comprises a second transistor having a first passive electrode, a second passive electrode, and a control electrode, wherein the second passive electrode of the second transistor is coupled to at least one terminal from the first set of terminals of the first current mirror, and wherein the control electrode of the second transistor is coupled to the current source, and wherein the first passive electrode of the second transistor is coupled to at least one terminal from the second set of terminals of the second current mirror.

In accordance with a preferred embodiment of the present invention, the apparatus further comprises: a first voltage rail; a second voltage rail; a first set of resistors, wherein each resistor from the first set of resistors is coupled between the first voltage rail and at least one terminal from the first set of terminals of the first current mirror; and a second set of resistors, wherein each resistor from the second set of resistors is coupled between the second voltage rail and at least one terminal from the first set of terminals of the second current mirror.

In accordance with a preferred embodiment of the present invention, an apparatus is provided. The apparatus comprises a first current mirror having: a first transistor that receives an input signal at its first passive electrode and that is coupled to an output node at its second passive electrode; a second transistor that is diode-connected, wherein the control electrode of the first transistor is coupled to the control electrode of the second transistor; and a third transistor that is coupled to the control electrode of the second transistor at its control electrode; a fourth transistor that is coupled to the second passive electrode of the second transistor at its first passive electrode and that is coupled to the second passive electrode of the third transistor at its control electrode; a current source that is coupled to the control electrode of the fourth transistor; and a second current mirror having: a fifth transistor that is coupled to the second passive electrode of the fourth transistor at its first passive electrode and that is coupled to the output node at its second passive electrode; a sixth transistor that is diode-connected, wherein the control electrode of the sixth transistor is coupled to the control electrode of the fifth transistor; and a seventh transistor that is coupled to the control electrode of the sixth transistor at its control electrode and that is coupled to the current source at its second passive electrode.

In accordance with a preferred embodiment of the present invention, the apparatus further comprises an eighth transistor that is coupled to the first passive electrode of the first transistor at its second passive electrode, that is coupled to the current source at its control electrode, and that is coupled to the second passive electrode of the sixth transistor at its first passive electrode.

In accordance with a preferred embodiment of the present invention, the apparatus further comprises: a first voltage rail; a second voltage rail; a first resistor that is coupled between the first voltage rail and the first passive electrode of the first transistor; a second resistor that is coupled between the first voltage rail and the first passive electrode of the second transistor; a third resistor that is coupled between the first voltage rail and the first passive electrode of the third transistor; a fourth resistor that is coupled between the second voltage rail and the first passive electrode of the fifth transistor; a fifth resistor that is coupled between the second voltage rail and the first passive electrode of the sixth transistor; and a sixth resistor that is coupled between the second voltage rail and the first passive electrode of the seventh transistor.

In accordance with a preferred embodiment of the present invention, the first, second, third, and fourth transistors are a PNP transistors.

In accordance with a preferred embodiment of the present invention, the fifth, sixth, and seventh transistors are NPN transistors.

In accordance with a preferred embodiment of the present invention, an apparatus is provided. The apparatus comprises a first voltage rail; a second voltage rail; a first current mirror having: a first PNP transistor that receives an input signal at its emitter and that is coupled to an output node at its collector; a second PNP transistor that is diode-connected, wherein the base of the first bipolar transistor is coupled to the base of the second bipolar transistor; and a third PNP transistor that is coupled to the base of the second bipolar transistor at its base; a fourth PNP transistor that is coupled to the collector of the second PNP transistor at its emitter and that is coupled to the collector of the third PNP transistor at its base; a current source that is coupled to the base of the fourth PNP transistor; a second current mirror having: a first NPN transistor that is coupled to the collector of the fourth PNP transistor at its emitter and that is coupled to the output node at its collector; a second NPN transistor that is diode-connected, wherein the base of the second NPN transistor is coupled to the base of the first NPN transistor; and a third NPN transistor that is coupled to the base of the second NPN transistor at its base and that is coupled to the current source at its collector; a fourth NPN transistor that is coupled to the collector of the second NPN transistor at its emitter, that is coupled to the collector of the third NPN transistor at its base, and that is coupled to the emitter of the first PNP transistor at its collector; a first resistor that is coupled between the first voltage rail and the emitter of the first PNP transistor; a second resistor that is coupled between the first voltage rail and the emitter of the second PNP transistor; a third resistor that is coupled between the first voltage rail and the emitter of the third PNP transistor; a fourth resistor that is coupled between the second voltage rail and the emitter of the first NPN transistor; a fifth resistor that is coupled between the second voltage rail and the emitter of the second NPN transistor; and a sixth resistor that is coupled between the second voltage rail and the emitter of the third NPN transistor.

In accordance with a preferred embodiment of the present invention, the first and fourth resistors are each about 90Ω.

In accordance with a preferred embodiment of the present invention, the second and fifth resistors are each about 1.6 kΩ.

In accordance with a preferred embodiment of the present invention, the third and sixth resistors are each about 200Ω.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
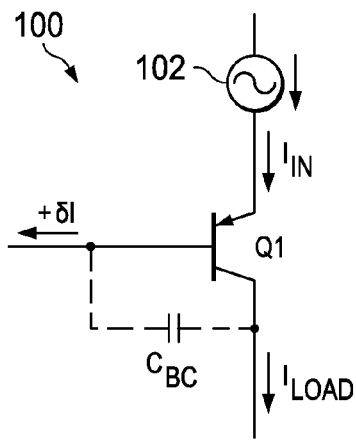
FIG. 1 is a conventional bipolar common base amplifier gain stage.

Refer now to the drawings wherein depicted elements are, for the sake of clarity, not necessarily shown to scale and wherein like or similar elements are designated by the same reference numeral through the several views.

Figure 2:
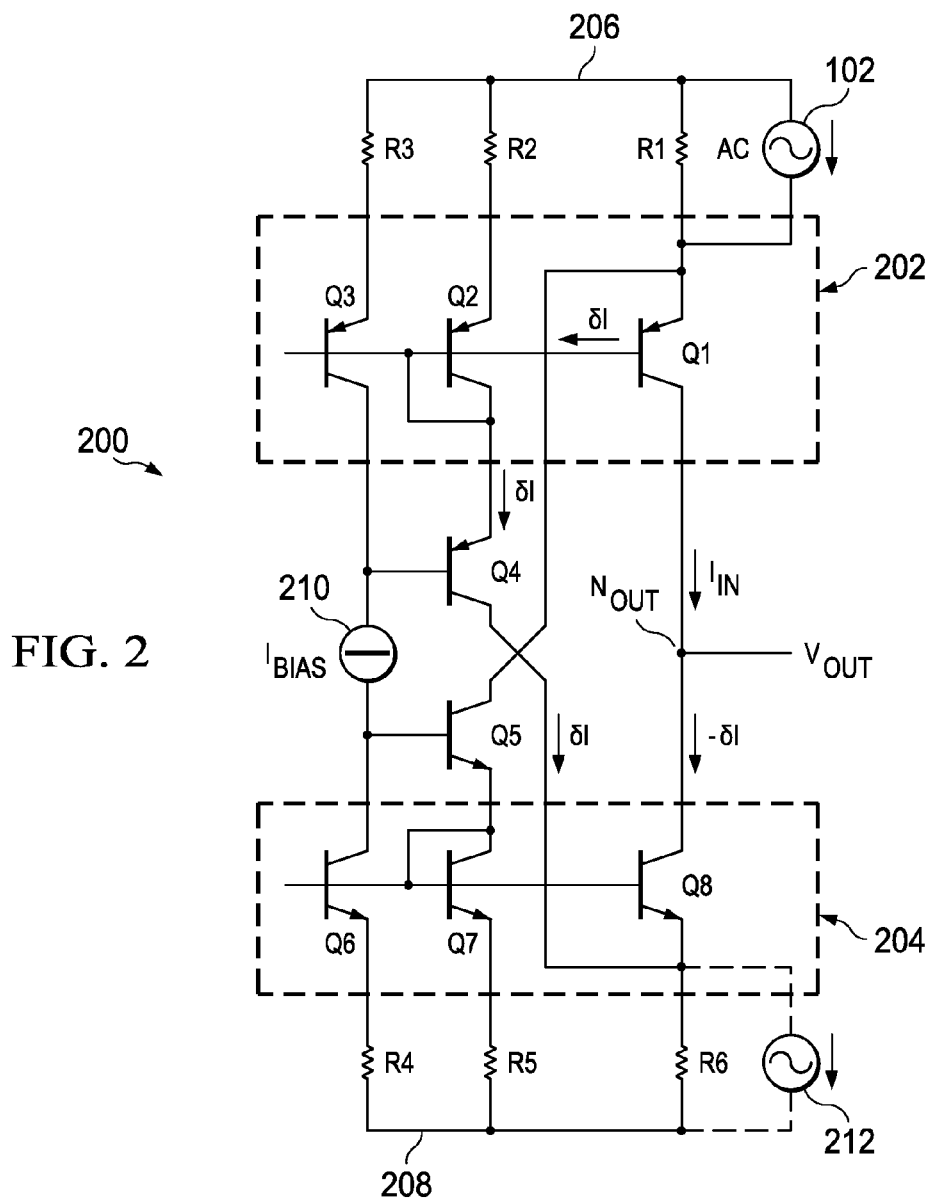
FIG. 2 is an example of a bipolar common base amplifier gain stage in accordance with a preferred embodiment of the present invention.

Referring to FIG. 2 of the drawings, the reference numeral 200 generally designates an example of a bipolar common base amplifier gain stage in accordance with a preferred embodiment of the present invention. Stage 200 generally comprises current mirrors 202 and 204, voltage rails 206 and 208, bias current source 210, transistors Q4 and Q5 (which are preferably PNP and NPN transistors, respectively), and resistors R1 through R6. Current mirror 202 is generally comprised of transistors Q1, Q2, and Q3 (which are preferably PNP transistors, where transistor Q2 is diode-connected, and where transistor Q1 generally corresponds to transistor Q1 of stage 100), and current mirror 204 is generally comprised of transistors Q6, Q7, and Q8 (which are preferably NPN transistors and wherein transistor Q7 is diode-connected). It should also be noted that the stage 200 can be implemented with CMOS transistors.

As can be seen, stage 200 is symmetrical. Resistors R1, R2, and R3 (preferably having values of about 200Ω, 1.6 kΩ, and 90Ω, respectively) are coupled between voltage rail 206 and a first set of terminals of current mirror 202 (which are preferably the emitters of transistors Q1, Q2, and Q3), and resistors R4, R5, and R6 (preferably having values of about 200Ω, 1.6 kΩ, and 90Ω, respectively) are coupled between voltage rail 208 and a first set of terminals of current mirror 204 (which are preferably the emitters of transistors Q6, Q7, and Q8). The second set of terminals of current mirrors 202 and 204 (which are the collectors of transistors Q1, Q2, Q3, Q6, Q7, and Q8) are then coupled to one another and to intermediate circuitry to measure the magnitude of an error current δI (which is generally the same as error current δI in stage 100) and compensate for the error current δI. Preferably, the collectors of transistors Q3 and Q6 are coupled to the bases of transistors Q4 and Q5 (respectively) and to bias current source 210 (which provides bias current $I_{BIAS}$). The emitters of transistors Q4 and Q5 are also preferably coupled to the collectors of transistors Q2 and Q7 (respectively), while the collectors of transistors Q4 and Q5 are preferably coupled to the emitters of transistors Q1 and Q8 (respectively). The collectors of transistors Q1 and Q8 are also preferably coupled to one another at output node NOUT, so as to generate output voltage VOUT.

In operation, an input current $I_{IN}$ (which is preferably an alternating current or AC) is provided to one terminal from the first set of terminals of current mirror 202 (preferably the emitter of PNP common base amplifier transistor Q1). Error current δI is output from the base of the transistor Q1 and passes through the diode connection of transistor Q2 so as to be added to the mirrored bias current $I_{BIAS}$ from transistor Q2. This error current δI is then provided to the emitter of transistor Q4 and further provided to one terminal from the first set of terminals of current mirror 204 (preferably the emitter of NPN common base transistor Q8). Essentially, transistors Q2, Q3, and Q4 are arranged to operate as a three transistor Wilson current mirror to provide a current, which is the sum of the mirrored bias current $I_{BIAS}$ and the error current δI, to the emitter of transistor Q8. Because of the base-collector capacitance of transistor Q1 (which would normally provide a current at node NOUT of $I_{IN}$-δI), the provision of the error current 61 to transistor Q8 compensates for the error current δI by subtracting the error current δI from the output current of transistor Q8 (which is the load current for transistor Q1), allowing the output current at node NOUT to be generally equal to the input current $I_{IN}$ provided by source 102. Basically, the subtraction of error current δI from the load current for transistor Q1 has the effect of increasing the signal current output from transistor Q1 by the amount of the error current δI in transistor Q1, thus, compensating for the error current δI.

Additionally, because a signal is typically provided to transistor from a second source (source 206), the symmetry of the stage 200 allows for error compensation for the error current generated as a result of the base-collector capacitance of transistor Q8.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first current mirror having a first and a second set of terminals, wherein at least one terminal from the first set of terminals of the first current mirror receives an input signal, and wherein at least one terminal from the second set of terminals of the first current mirror is coupled to an output node;
   a transistor having a first passive electrode, a second passive electrode, and a control electrode, wherein the transistor is coupled to at least one terminal from the second set of terminals of the first current mirror at its first passive electrode and to at least one terminal from the second set of terminals of the first current mirror at its control electrode;
   a current source that is coupled to the control electrode of the transistor; and
   a second current mirror having a first and a second set of terminals, wherein at least one terminal from the first set of terminals of the second current mirror is coupled to the second passive electrode of the transistor, and wherein at least one terminal from the second set of terminals of the second current mirror is coupled to the current source, and wherein at least one terminal from the second set of terminals of the second current mirror is coupled to the output node.

2. The apparatus of claim 1, wherein the transistor further comprises a PNP transistor, wherein the first passive electrode is the emitter, the second passive electrode is the collector, and the control electrode is the base.

3. The apparatus of claim 1, wherein the apparatus further comprises a second transistor having a first passive electrode, a second passive electrode, and a control electrode, wherein the second passive electrode of the second transistor is coupled to at least one terminal from the first set of terminals of the first current mirror, and wherein the control electrode of the second transistor is coupled to the current source, and wherein the first passive electrode of the second transistor is coupled to at least one terminal from the second set of terminals of the second current mirror.

4. The apparatus of claim 1, wherein the apparatus further comprises:
   a first voltage rail;
   a second voltage rail;
   a first set of resistors, wherein each resistor from the first set of resistors is coupled between the first voltage rail and at least one terminal from the first set of terminals of the first current mirror; and
   a second set of resistors, wherein each resistor from the second set of resistors is coupled between the second voltage rail and at least one terminal from the first set of terminals of the second current mirror.

5. An apparatus comprising:
   a first current mirror having:
      a first transistor that receives an input signal at its first passive electrode and that is coupled to an output node at its second passive electrode;
      a second transistor that is diode-connected, wherein the control electrode of the first transistor is coupled to the control electrode of the second transistor; and
      a third transistor that is coupled to the control electrode of the second transistor at its control electrode;
   a fourth transistor that is coupled to the second passive electrode of the second transistor at its first passive electrode and that is coupled to the second passive electrode of the third transistor at its control electrode;
   a current source that is coupled to the control electrode of the fourth transistor; and
   a second current mirror having:
      a fifth transistor that is coupled to the second passive electrode of the fourth transistor at its first passive electrode and that is coupled to the output node at its second passive electrode;
      a sixth transistor that is diode-connected, wherein the control electrode of the sixth transistor is coupled to the control electrode of the fifth transistor; and
      a seventh transistor that is coupled to the control electrode of the sixth transistor at its control electrode and that is coupled to the current source at its second passive electrode.

6. The apparatus of claim 5, wherein the apparatus further comprises an eighth transistor that is coupled to the first passive electrode of the first transistor at its second passive electrode, that is coupled to the current source at its control electrode, and that is coupled to the second passive electrode of the sixth transistor at its first passive electrode.

7. The apparatus of claim 5, wherein the apparatus further comprises:
   a first voltage rail;
   a second voltage rail;
   a first resistor that is coupled between the first voltage rail and the first passive electrode of the first transistor;
   a second resistor that is coupled between the first voltage rail and the first passive electrode of the second transistor;
   a third resistor that is coupled between the first voltage rail and the first passive electrode of the third transistor;
   a fourth resistor that is coupled between the second voltage rail and the first passive electrode of the fifth transistor;
   a fifth resistor that is coupled between the second voltage rail and the first passive electrode of the sixth transistor; and
   a sixth resistor that is coupled between the second voltage rail and the first passive electrode of the seventh transistor.

8. The apparatus of claim 5, wherein the first, second, third, and fourth transistors are a PNP transistors.

9. The apparatus of claim 5, wherein the fifth, sixth, and seventh transistors are NPN transistors.

10. An apparatus comprising:
    a first voltage rail;
    a second voltage rail;
    a first current mirror having:
       a first PNP transistor that receives an input signal at its emitter and that is coupled to an output node at its collector;

a second PNP transistor that is diode-connected, wherein the base of the first bipolar transistor is coupled to the base of the second bipolar transistor; and a third PNP transistor that is coupled to the base of the second bipolar transistor at its base;

a fourth PNP transistor that is coupled to the collector of the second PNP transistor at its emitter and that is coupled to the collector of the third PNP transistor at its base;

a current source that is coupled to the base of the fourth PNP transistor;

a second current mirror having:
- a first NPN transistor that is coupled to the collector of the fourth PNP transistor at its emitter and that is coupled to the output node at its collector;
- a second NPN transistor that is diode-connected, wherein the base of the second NPN transistor is coupled to the base of the first NPN transistor; and
- a third NPN transistor that is coupled to the base of the second NPN transistor at its base and that is coupled to the current source at its collector;

a fourth NPN transistor that is coupled to the collector of the second NPN transistor at its emitter, that is coupled to the collector of the third NPN transistor at its base, and that is coupled to the emitter of the first PNP transistor at its collector;

a first resistor that is coupled between the first voltage rail and the emitter of the first PNP transistor;

a second resistor that is coupled between the first voltage rail and the emitter of the second PNP transistor;

a third resistor that is coupled between the first voltage rail and the emitter of the third PNP transistor;

a fourth resistor that is coupled between the second voltage rail and the emitter of the first NPN transistor;

a fifth resistor that is coupled between the second voltage rail and the emitter of the second NPN transistor; and a sixth resistor that is coupled between the second voltage rail and the emitter of the third NPN transistor.

11. The apparatus of claim 10, wherein the first and fourth resistors are each about 90Ω.

12. The apparatus of claim 10, wherein the second and fifth resistors are each about 1.6 kΩ.

13. The apparatus of claim 10, wherein the third and sixth resistors are each about 200Ω.

* * * * *